United States Patent [19]

Gardner et al.

[11] Patent Number: 6,100,147
[45] Date of Patent: *Aug. 8, 2000

[54] METHOD FOR MANUFACTURING A HIGH PERFORMANCE TRANSISTOR WITH SELF-ALIGNED DOPANT PROFILE

[75] Inventors: Mark I. Gardner, Cedar Creek; Mark C. Gilmer, Austin, both of Tex.

[73] Assignee: Advanced Micro Devices, Inc., Sunnyvale, Calif.

[*] Notice: This patent is subject to a terminal disclaimer.

[21] Appl. No.: 09/061,778

[22] Filed: Apr. 16, 1998

[51] Int. Cl.$^7$ .................................................. H01L 21/336
[52] U.S. Cl. .......................... 438/301; 438/519; 438/585; 438/691; 257/402
[58] Field of Search .................................. 438/230, 301, 438/519, 585, 691, 942

[56] References Cited

U.S. PATENT DOCUMENTS

| | | | |
|---|---|---|---|
| 5,116,771 | 5/1992 | Karulkar | 438/163 |
| 5,391,510 | 2/1995 | Hsu et al. | 438/301 |
| 5,399,508 | 3/1995 | Nowak | 438/291 |

OTHER PUBLICATIONS

Stanley Wolf and Richard N. Tauber, Silicon Processing for the VLSI Era, vol. 2, pp. 144–152, 182–188, 318, 332–333, 419–439, Dec. 1990.

Stanley Wolf and Richard N. Tauber, Silicon Processing for the VLSI Era, vol. 3, The Submicron MOSFET pp. 367–407, Dec. 1995, Publication U.S.

*Primary Examiner*—Wael Fahmy
*Assistant Examiner*—William David Coleman

[57] ABSTRACT

A process for manufacturing a high performance transistor with self-aligned dopant profile. The process involves forming a source/drain mask pattern on a substrate. With a first implant material, unmasked portions of the substrate are doped to form source/drain regions of the substrate. The source-drain mask is removed and an oxidation layer is grown, where portions of the oxidation layer formed from doped regions of the substrate have heights that are greater than heights of portions of the oxidation layer formed from un-doped regions of the substrate, thereby forming a gate mask. The doped portions of the substrate are self-aligned with gate regions of the substrate. The gate regions are doped, and gate electrodes are formed. The gate mask is removed to expose source/drain regions of the substrate for further fabrication.

21 Claims, 3 Drawing Sheets

METHOD FOR MANUFACTURING A HIGH PERFORMANCE TRANSISTOR WITH SELF-ALIGNED DOPANT PROFILE

FIELD OF THE INVENTION

The present invention is directed generally to semiconductor devices and, more particularly, to a process for manufacturing semiconductors to reduce manufacturing time and improve semiconductor performance.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applicability and numerous disciplines. One such silicon-based semiconductor device is a metal-oxide-semiconductor (MOS) transistor.

The principal elements of a typical MOS semiconductor device are illustrated in FIG. 1. The device generally includes a gate electrode 103, which acts as a conductor, to which an input signal is typically applied via a gate terminal (not shown). Heavily doped source/drain regions 105 are formed in a semiconductor substrate 101 and are respectively connected to source and drain terminals (not shown). A channel region 107 is formed in the semiconductor substrate 101 beneath the gate electrode 103 and separates the source/drain regions 105. The channel is typically lightly doped with a dopant type opposite to that of the source/drain regions 105. The gate electrode 103 is physically separated from the semiconductor substrate 101 by a gate insulating layer 109, typically an oxide layer such as $SiO_2$. The insulating layer 109 is provided to prevent current from flowing between the gate electrode 103 and the source/drain regions 105 or channel region 109.

In operation, an output voltage is typically developed between the source and drain terminals. When an input voltage is applied to the gate electrode 103, a transverse electric field is set up in the channel region 107. By varying the transverse electric field, it is possible to modulate the conductance of the channel region 107 between the source region/drain regions 105. In this manner an electric field controls the current flow through the channel region 107. This type of device is commonly referred to as a MOS field-effect-transistors (MOSFET).

Semiconductor devices, like the one described above, are used in large numbers to construct most modern electronic devices. In order to increase the capability of such electronic devices, it is necessary to integrate ever increasing numbers of such devices into a single silicon wafer. As the semiconductor devices are scaled down (i.e., made smaller) and in order to form a larger number of devices on a given surface area, the structure of the devices and fabrication techniques used to make such devices must be altered.

Conventional techniques for forming transistors impose limitations on the ability to further reduce transistor sizes. Thus, the ability to further scale down the semiconductor devices is hindered.

SUMMARY OF THE INVENTION

Generally, the present invention relates to a process for making a semiconductor device. The process reduces usage of manufacturing resources and improves semiconductor performance by using a process that self-aligns sources/drains with gate channels by using an As implant both to dope source and drain regions as well as to form a mask to build a gate stack.

In one embodiment, the invention is a method for making a semiconductor device. The method comprises the steps of: forming a silicon substrate; forming a pattern on the substrate with mask material, the pattern defining source/drain regions on the substrate; doping with a first implant unmasked portions of the substrate to form source/drain regions of the substrate; removing the mask material from the substrate; growing an oxidation layer on the substrate, wherein mask portions of the oxidation layer formed from doped regions of the substrate have heights that are greater than heights of portions of the oxidation layer formed from un-doped regions of the substrate; doping with a second implant regions of the substrate that are not masked by the mask portions of the oxidation layer; depositing gate electrode material to form a gate electrode layer on the oxidation layer; polishing the gate electrode layer to provide a generally planar surface and expose the mask portions of the oxidation layer; and removing the mask portions of the oxidation layer to expose source/drain regions of the substrate.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
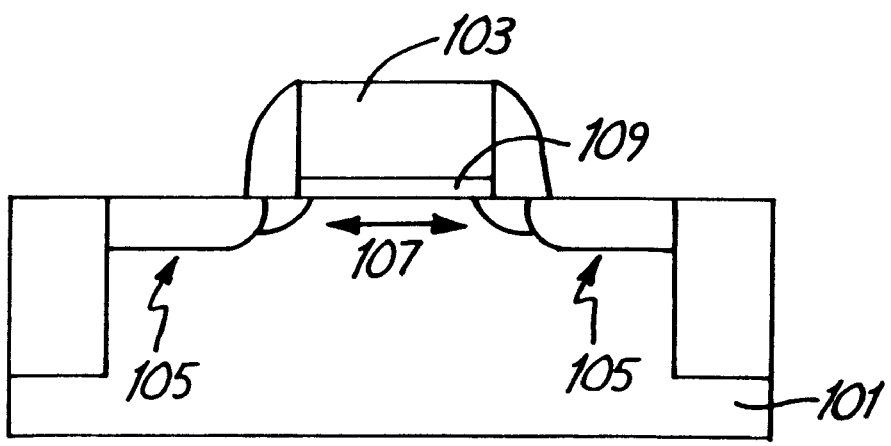
FIG. 1 illustrates a conventional MOS device.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a number of semiconductor transistor structures. The invention has been found to be particularly advantageous in applications where it is desirable to form an NMOS transistor. While the present invention is not so limited, an appreciation of various aspects of the invention is best gained through a discussion of various application examples of processes used to form such semiconductor devices.

FIGS. 2A–E illustrate a process for constructing a semiconductor structure in accordance with various example embodiments of the invention. Generally, an As implant is used to dope source and drain regions on a substrate, and an oxidation layer grown over the As implant regions defines the gate. Deposition of the gate electrode followed by removal of the oxidation layer produces a transistor having self-aligned source/drain junctions.

Figure 2A:
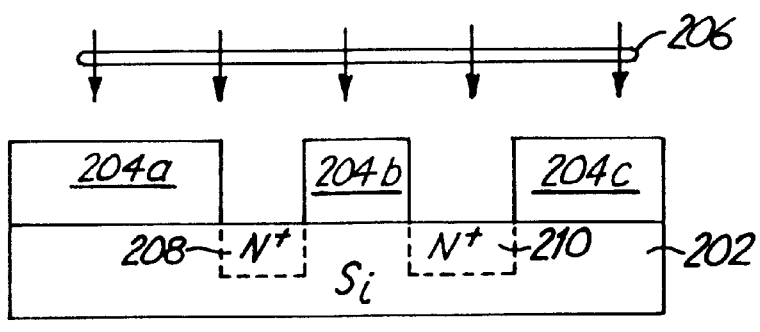
FIG. 2A is a cross-sectional view of a source/drain mask on a silicon substrate made in accordance with an example embodiment of the invention.

FIG. 2A is a cross-sectional view of a source/drain mask on a silicon substrate made in accordance with an example embodiment of the invention. Silicon substrate 202 is formed using conventional processes, and then a source/drain mask pattern is formed on the substrate 202. Portions 204a, 204b, and 204c depict the remaining mask material that remains after the pattern is formed. The masking pattern may, for example, be formed using well-known photolithography techniques. These techniques generally include forming a masking layer over the entire substrate 202, patterning the masking layer with a mask pattern (typically defined in a reticle or mask depending on the photolithography process used), and developing the masking layer to selectively remove portions of the masking layer.

After the source/drain mask pattern is formed, an As implant, as represented by arrows 206, is applied to the resultant structure. The As implant results in the formation of N+ regions in the substrate which are used for the source and drain of the transistor. It will be appreciated that the As implant does not penetrate the source/drain mask portions 204a–c. However, the doped regions 208 and 210 extend to the edge of mask portion 204b, where mask portion 204b occupies the region of substrate 202 where a gate electrode will be formed, as described later herein. In an example embodiment, the As implant dose is 5E15 ions/cm$^2$, and the implant energy level is 10 to 50 KeV. Alternatively, phosphorous could be used instead of the As implant. An example implant dose for phosphorous is 6E15 ions/cm$^2$ with an energy level of 10 KeV.

Figure 2B:
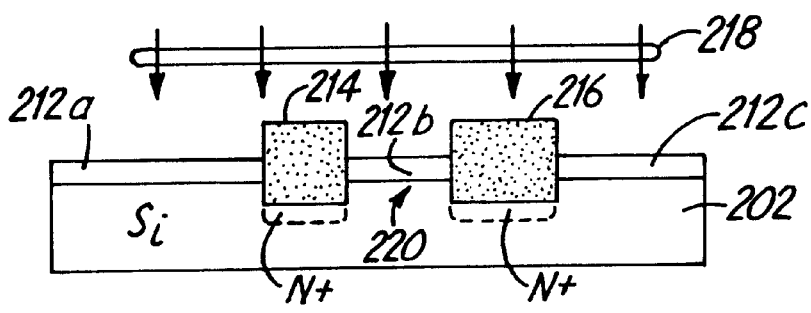
FIG. 2B is a cross-sectional view of a silicon substrate having an oxidation layer grown on un-doped portions of the substrate and on doped portions of the substrate.

FIG. 2B is a cross-sectional view of a silicon substrate having an oxidation layer grown on un-doped portions of the substrate and on doped portions of the substrate. First, the source/drain mask is removed from the substrate using conventional techniques, and then an oxidation layer is grown on the substrate. The oxidation layer consists of portions 212a, 212b, and 212c that are grown from un-doped regions of the substrate 202, and portions 214 and 216 that are grown from As doped portions of the substrate. The portions 214 and 216 are hereinafter referred to as "As-growth regions" for convenience.

It will be appreciated that the As implant causes an increased oxide growth rate relative to regions of substrate without the As implant. The growth ratio of oxide in doped regions versus un-doped regions ranges from approximately 6:1 to 10:1. For an 8:1 growth ratio, if 100 Å of oxide is grown in an un-doped portion of the substrate, the regions of oxide grown in the implant regions is approximately 800 Å. In an example embodiment, 200 Å of oxide is grown in un-doped regions, and 1600 Å of oxide is grown in doped regions. With the difference in oxide growth rates, a desired height difference between the source/drain regions and the adjacent regions is achievable.

A channel implant is performed as indicated by arrows 218. The channel implant is used to lightly dope the channel region 220 of the transistor. In an example embodiment, the channel implant dose is from approximately 2.0 to 8.0E12 ions/cm$^2$ and the implant energy level is from about 10 to 70 KeV. It will be appreciated that Boron is often used for NMOS devices and phoshorous is used for PMOS devices.

Figure 2C:
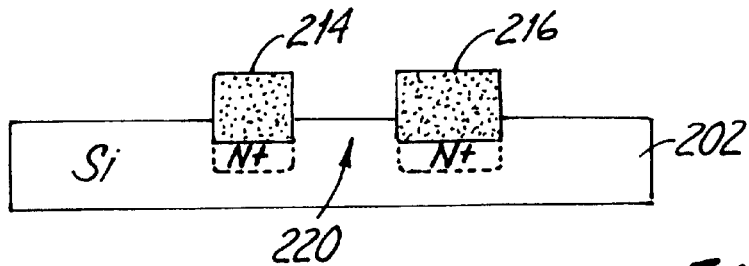
FIG. 2C is a cross-sectional view of a substrate along with As-growth regions of the oxidation layer.

FIG. 2C is a cross-sectional view of a substrate along with As-growth regions of the oxidation layer. The oxidation layer portions 212a–c are etched from the substrate 202 leaving the As-growth regions to form the illustrated semiconductor structure. It will be appreciated that a Reactive Ion Etch (RIE), plasma etch or wet etch could be used to remove the oxide portions 212a–c, while leaving the As-growth regions. In this manner, channel regions are formed on the substrate, for example channel region 220.

The N+ regions under the As-growth regions 214 and 216 form the regions for the source and drain of a transistor.

Figure 2D:
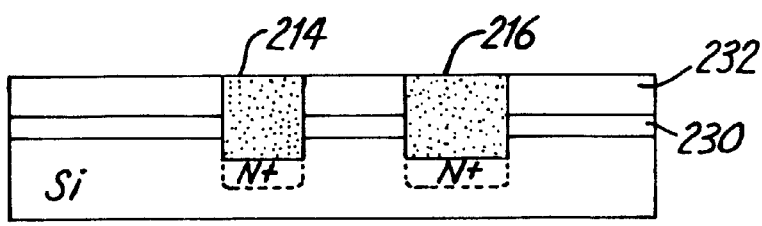
FIG. 2D is a cross-sectional view of a semiconductor structure, according to an example embodiment of the invention, after forming a gate-quality oxide layer and forming a gate electrode layer.

FIG. 2D is a cross-sectional view of a semiconductor structure, according to an example embodiment of the invention, after forming a gate-quality oxide layer and forming a gate electrode layer. The gate-quality oxide layer 230 is formed using conventional techniques. It will be appreciated that oxide layer 230 could be, in an alternate embodiment an oxynitride layer. In the example embodiment, oxide layer 230 is from about 15 to 25 Å thick.

In an alternate embodiment, the process described herein could be modified such that the oxidation layer portions 212a–c of FIG. 2B are gate-quality oxides. In combination, removal of the oxidation layer portions 212a–c as shown in FIG. 2C is eliminated. In this embodiment, an additional process is not required to form the gate-quality oxidation layer 230 of FIG. 2D.

The gate electrode layer 232 is formed, for example, by depositing poly-silicon, amorphous silicon, or a metal (e.g., tungsten or copper) using known techniques. The thickness of the gate electrode layer is selected in consideration of the desired thickness of the gate electrode stack. In the example embodiment, the As-growth regions are used to define the height of the gate electrode stack. In an example embodiment, the deposited poly-silicon layer is approximately 4,000–6,000 Å, which is then polished to reduce the thickness to that of the height of the As-growth regions 214 and 216. After polishing, the top surface of the poly-silicon layer is substantially flush with the surface of the As-growth regions, thereby exposing the top surface of As-growth regions 214 and 216 so that the regions can be removed in the next stage of the process.

Figure 2E:
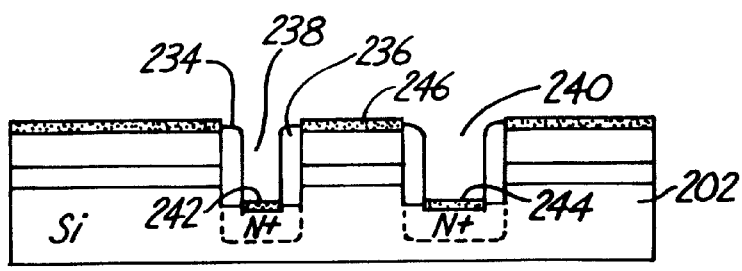
FIG. 2E is a cross-sectional view of a semiconductor structure, according to an example embodiment, after removal of the As-growth regions.

FIG. 2E is a cross-sectional view of a semiconductor structure, according to an example embodiment, after removal of the As-growth regions. As can be seen, the As-growth regions 214 and 216 seen in FIG. 2D have been removed. The As-growth regions are removed by plasma or wet etch. After removal of the As-growth regions 214 and 216, the N+ doped portions of the substrate 202 are exposed.

Next, oxide spacers, for example 234 and 236, are formed in the openings 238 and 240 in a conventional manner. Through a salicidation process, respective Silicide contacts 242, 244, and 246 are formed for the source/drain regions and the poly-silicon gate. In an example embodiment, the salicidation process uses a Titanium deposition to form TiSi$_2$. Fabrication may continue with well-known fabrication processes to complete the ultimate device structure.

It will be appreciated that the As implant performed early in the process, reduces manufacturing time by eliminating additional masking steps. The As implants defines where the junctions are placed, and self-aligns the sources/drains with the gate regions. In contrast, the prior art requires additional masking steps to form the transistor.

In addition, the invention provides a shallow depth for the source/drain junctions by consumption of the silicon during the SiO$_2$ growth.

Further still, the invention eliminates the need for formation of a LDD region because the source/drain junctions are aligned to the edge of the channel. Because no LDD implant is required, less processing is required to construct the semiconductor structure, thereby reducing usage of manufacturing resources.

As noted above, the present invention is applicable to fabrication of a number of different devices. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art upon review of the present specification. The claims are intended to cover such modifications and devices.

We claim:

1. A method for manufacturing a semiconductor structure, comprising the steps of:

forming a silicon substrate;

forming a pattern on the substrate with mask material, the pattern defining source/drain regions on the substrate;

doping with a first implant unmasked portions of the substrate to form source/drain regions of the substrate;

removing the mask material from the substrate;

growing an oxidation layer on the substrate, wherein mask portions of the oxidation layer formed from doped regions of the substrate have heights that are greater than heights of portions of the oxidation layer formed from un-doped regions of the substrate;

doping with a second implant regions of the substrate that are not masked by the mask portions of the oxidation layer;

depositing gate electrode material to form a gate electrode layer on the oxidation layer;

polishing the gate electrode layer to provide a generally planar surface and expose the mask portions of the oxidation layer; and removing the mask portions of the oxidation layer to expose source/drain regions of the substrate.

2. The method of claim 1, further comprising the steps of:

forming spacers; and forming Silicide contacts on the substrate at the source/drain regions and on the gate electrode.

3. The method of claim 2, wherein the step of forming the Silicide contacts is performed by salicidation.

4. The method of claim 3, wherein the step of forming the Silicide contacts is performed using Ti.

5. The method of claim 1, further comprising the steps of:

removing portions of the oxide layer formed on un-doped regions of the substrate; and growing a gate-quality oxidation layer on the substrate before depositing the gate electrode material.

6. The method of claim 5, wherein the gate quality oxidation layer is from about 15 to 25 Å thick.

7. The method of claim 1, wherein the first implant is As.

8. The method of claim 7, wherein the step of doping with the first implant is performed with an energy level of approximately 10 to 50 KeV.

9. The method of claim 7, wherein the step of doping with the first implant is performed with a dose rate of approximately 5E15 ions/cm$^2$.

10. The method of claim 7, wherein the oxidation layer grown in un-doped regions is approximately 200 Å thick, and the oxidation layer grown in doped regions is approximately 1600 Å thick.

11. The method of claim 7, wherein the gate electrode material is poly-silicon.

12. The method of claim 11, wherein the poly-silicon material deposited is approximately 4,000–6,000 Å thick.

13. The method of claim 1, wherein the first implant is phosphorous.

14. The method of claim 13, wherein the step of doping with the first implant is performed with an energy level of approximately 10 KeV.

15. The method of claim 13, wherein the step of doping with the first implant is performed with a dose rate of approximately 6E15 ions/cm$^2$.

16. The method of claim 1, wherein the second implant is Boron.

17. The method of claim 16, wherein the step of doping with the second implant is performed with an energy level of approximately 10 to 70 KeV.

18. The method of claim 16, wherein the step of doping with the second implant is performed with a dose rate of approximately 2.0 to 8.0E12 ions/cm$^2$.

19. The method of claim 1, wherein the second implant is phosphorous.

20. The method of claim 19, wherein the step of doping with the second implant is performed with an energy level of approximately 10 to 70 KeV.

21. The method of claim 19, wherein the step of doping with the second implant is performed with a dose rate of approximately 2.0 to 8.0E12 ions/cm$^2$.

* * * * *